United States Patent
Kahn et al.

[11] Patent Number: 5,963,881
[45] Date of Patent: Oct. 5, 1999

[54] METHOD AND SYSTEM FOR ENHANCING THE IDENTIFICATION OF CAUSES OF VARIATIONS IN THE PERFORMANCE OF MANUFACTURED ARTICLES

[75] Inventors: Randolph W. Kahn, McKinney; Hank G. Prosack, Sherman; Kenneth G. Vickers, Whitesboro, all of Tex.

[73] Assignee: Texas Instruments Incorporated, Dallas, Tex.

[21] Appl. No.: 08/954,008

[22] Filed: Oct. 20, 1997

Related U.S. Application Data

[63] Continuation of application No. 08/532,902, Sep. 22, 1995, abandoned.

[51] Int. Cl.[6] .............................. G06F 19/00; H01L 21/66
[52] U.S. Cl. .............................. 702/35; 702/185; 702/81; 364/468.17; 364/468.28; 382/149; 382/145; 438/16; 438/17; 438/5
[58] Field of Search ................. 364/468.17, 468.15, 364/468.16, 468.28; 702/35, 82, 81, 185, 183, 182; 356/237; 438/17, 16, 10, 5, 14; 382/149, 145, 225, 228, 170

[56] References Cited

U.S. PATENT DOCUMENTS

| | | | |
|---|---|---|---|
| 5,161,158 | 11/1992 | Chakravarty et al. | 395/183.02 |
| 5,240,866 | 8/1993 | Friedman et al. | 437/8 |
| 5,294,812 | 3/1994 | Hashimoto et al. | 257/65 |
| 5,339,257 | 8/1994 | Layden et al. | 364/552 |
| 5,450,326 | 9/1995 | Black | 364/468 |
| 5,526,293 | 6/1996 | Mozumder et al. | 364/578 |
| 5,665,609 | 9/1997 | Mori | 438/16 |
| 5,716,856 | 2/1998 | Lin et al. | 437/8 |
| 5,801,965 | 9/1998 | Takagi et al. | 702/35 |

OTHER PUBLICATIONS

H. Singh, G. Scher, R. Billings and J. Pankratz, Equipment Specification "Sematech Wafer Sleuth Implementation Guide, 91060587A–ENG", Sep. 25, 1991.

*Primary Examiner*—James P. Trammell
*Assistant Examiner*—Tuan Q. Dam
*Attorney, Agent, or Firm*—David Denker; Robby T. Holland; Richard L. Donaldson

[57] ABSTRACT

In a system (12) wherein articles are manufactured by a plurality of process steps (20, 22, & 24), a method for identifying causes of variations in performance of the manufactured articles is provided. The method includes tracking orientation data (48) for the articles during each of the process steps (20, 22, & 24) and then measuring (50) performance data for each of the articles. The method also includes preparing surface performance characteristic maps (54) for each of the articles from the performance data and ordering the surface performance characteristic maps (56) for each of the articles in accordance with the orientation data for each article at a given process step (20, 22, & 24).

26 Claims, 6 Drawing Sheets

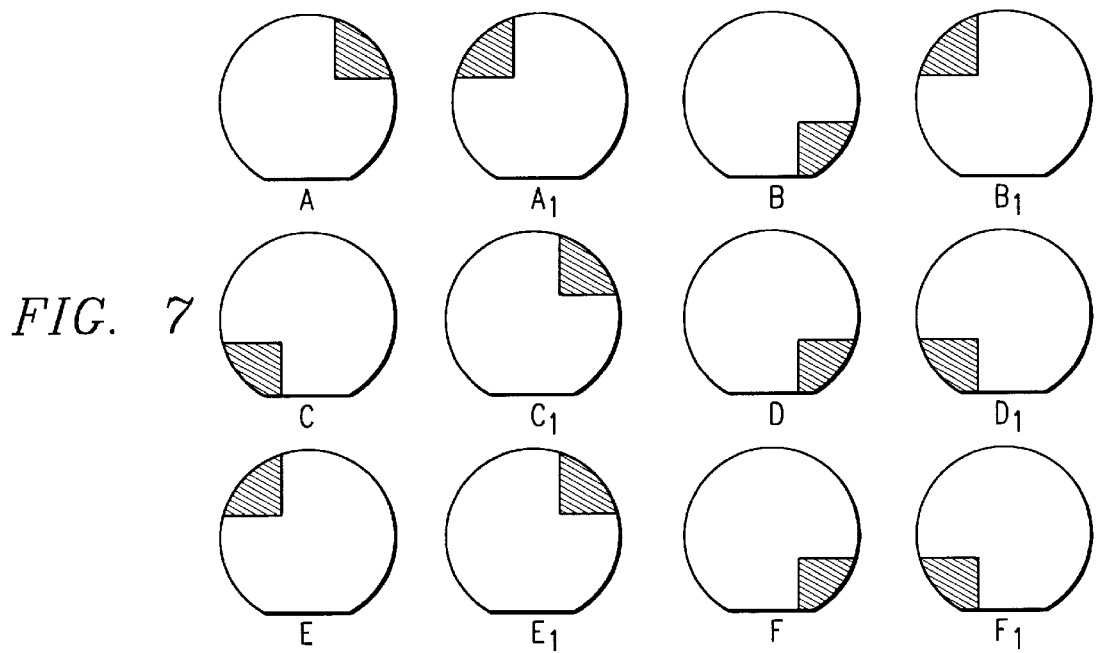
FIG. 7
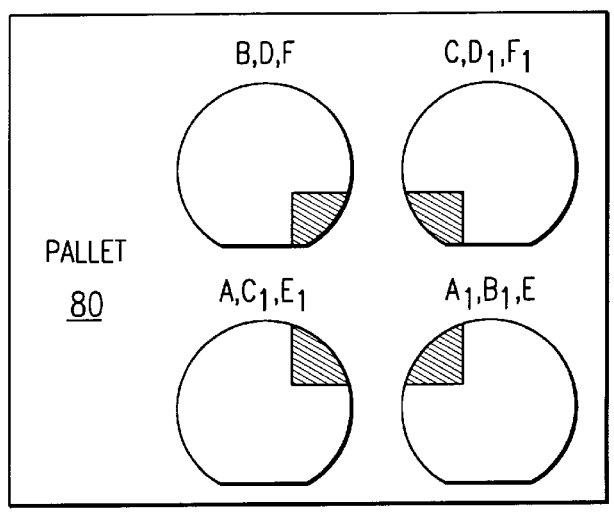
FIG. 8
FIG. 9
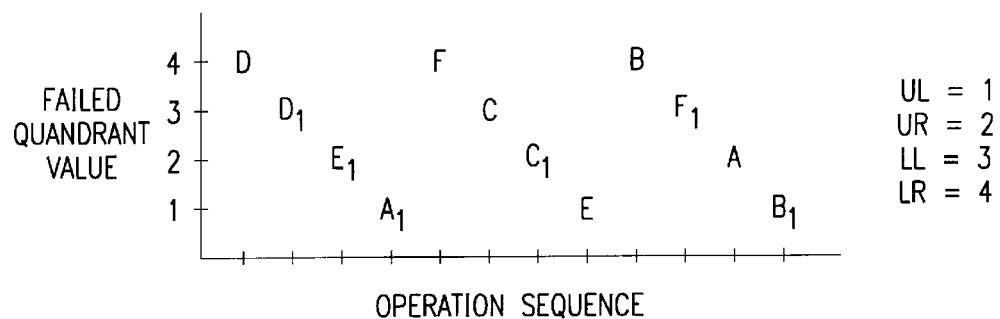

METHOD AND SYSTEM FOR ENHANCING THE IDENTIFICATION OF CAUSES OF VARIATIONS IN THE PERFORMANCE OF MANUFACTURED ARTICLES

This application is a Continuation of application Ser. No. 08/532,902, filed Sep. 22, 1995, now abandoned.

TECHNICAL FIELD OF THE INVENTION

This invention relates in general to the field of manufacturing analysis systems, and more particularly, to a method and system for enhancing the identification of causes of variations in the performance of manufactured articles.

BACKGROUND OF THE INVENTION

Most manufactured articles are the result of several processing steps. Many manufactured articles are processed in lots with each lot containing multiple articles. The quality of the final articles in a lot is affected by each processing step. A defective or inferior article results wherever any of the processing steps varies beyond an acceptable limit. This is true whether the manufactured article is a semiconductor microcircuit, a piece of metal, printed money, a piece of glass, or any other article that undergoes one or more processing steps during its manufacture.

Once manufacturing of an article occurs for a sufficient period of time a set of measurable performance characteristics may be developed as a measure of the article's quality or "goodness." The performance characteristics for the article are typically measured at "final test" after all processing of the article or at a suitable point during the manufacture of the article. For example, in printing money, once the money is printed, the clarity of the printing provides a measure of quality of the printing. In semiconductor processing, electrically testing individual die on a completed semiconductor wafer determines the acceptability of each die and the yield for the wafer. In short, testing completed manufactured articles provides a measure of their acceptability.

Additionally, inadequacies or failures occurring at "final test" can generally be traced to a given process step in the manufacturing process. Prior systems for analyzing failures during testing use an analytical approach that looks at the number of unacceptable articles in the entire lot and the type of test failures to correlate the failures to a given process step during the manufacture of the articles. These prior systems for analyzing failures during testing of a lot of manufactured articles generally provide acceptable indications of the failure mechanism provided there is a single cause for the failures. If, however, the failures are the result of more than one failure mechanism, correlating the test failures to a given process step becomes more difficult.

One previously developed tool for correlating electrical failures in semiconductor die in a lot of wafers to a process step uses the yield of each wafer at multiprobe (MP) test with the sequential or spatial positions of the wafers at each process step in analyzing the failures at MP test. By knowing the failed test and the sequential or spatial processing of the wafers, this prior system can correlate the failures at MP test to a given processing step, e.g., ion implantation or anneal. Such a system works generally well provided the failures at MP test are the result of a single errant processing step. The Wafer Sleuth System developed by Sematech is such a failure analysis tool and is described in Sematech document entitled "Wafer Sleuth Implementation Guide" document 91060587A-ENG, dated Sep. 25, 1991.

Systems for analyzing and correlating failures at final test to manufacturing steps for other types of manufactured articles suffer from the same deficiencies as the semiconductor processing analysis system described above. Because these prior systems use only yield and sequential or spatial data in their analysis, they may fail to detect when multiple failure mechanisms result in unacceptable test results. Also, because prior systems for analyzing failures use purely numerical analysis, their outputs may require significant time to analyze and understand. Additionally, prior failure analysis systems are not affective when the lots processed contain a small number of articles, e.g., four pieces per lot, where the acceptance level would be 0%, 25%, 50%, 75% or 100%.

SUMMARY OF THE INVENTION

Therefore a need has arisen for a method and system for identifying the causes of variations in the performance of manufactured articles.

One aspect of the present invention provides, in a system wherein articles are manufactured by a plurality of process steps, a method for identifying causes of variations in performance of the manufactured articles. The method includes tracking orientation data for the articles during each of the process steps and then measuring performance data for each of the articles. The method also includes preparing performance characteristic maps for each of the articles from the performance data and ordering the performance characteristic maps for each of the articles in accordance with the orientation data for each article at a given process step.

Another aspect of the present invention provides a system for identifying causes of variations in performance of manufactured articles when the articles are manufactured by a plurality of process steps. The system includes an article tracking system for tracking orientation data for each article at each process step and a tester for measuring performance data for each of the articles. The system also includes a processing system for preparing performance characteristic maps for each of the articles from each article's performance data and for ordering the performance characteristic maps for each of the articles in accordance with the orientation data for each article at each given process step.

Yet another aspect of the present invention provides, in a system wherein articles are manufactured by a plurality of process steps, a method for identifying causes of variations in performance of the manufactured articles. The method includes the steps of tracking sequential and spatial orientation data for the articles during each of the process steps and measuring performance data for each of the articles. The method also includes preparing performance characteristic maps for each of the articles from the performance data and ordering the performance characteristic maps for each of the articles in accordance with the orientation data for each article at a given process step. The method includes displaying the surface performance characteristic maps for each of the articles in the orientation of the articles for a given process step. The method also includes correlating the performance data for each of the articles to known variation causes to identify a cause for the variations in the performance of each article.

The present system and method provides several technical advantages. One technical advantage provided by the present invention is a method and system for accelerating the rate of identifying causes or variations in the performance of manufactured articles. Because the present system integrates spatial and/or sequential data for each article within a lot to a surface performance characteristic for each article, it provides an efficient method to analyze and identify failure mechanisms affecting a manufacturing process. The present system is particularly beneficial in identifying when multiple failure mechanisms affect a lot.

Another technical advantage of the present invention is that it reduces the time necessary to analyze a manufacturing process, which in turn, reduces cost associated with the analysis.

Yet another technical advantage of the present invention is that it aids in increasing yield for a manufacturing process because it identifies more quickly errant processes that negatively affect yield.

BRIEF DESCRIPTION OF THE DRAWINGS

For a more complete understanding of the present invention and the advantages thereof, reference is now made to the following descriptions taken in conjunction with the accompanying drawings, in which like reference numbers indicate like features and wherein:

FIG. 7 illustrates sequential oriented surface maps for the lot of manufactured articles in FIG. 6;

FIG. 8 illustrates spatially oriented surface maps for the lot manufactured articles in FIGS. 6 and 7;

FIGS. 9 and 10 show a graph of a performance characteristic for the lot of manufactured articles in FIGS. 6, 7, and 8 with alternate designations for the performance characteristics using the present invention;

DETAILED DESCRIPTION OF THE INVENTION

Preferred embodiments of the present invention are illustrated in the FIGURES, like numerals being used to refer to like and corresponding parts of various drawings.

Previously developed failure analysis systems can correlate test results for a lot of manufactured articles to a given process step as the cause of failures or variations from norm within the lot. In such systems, each article in the lot has an associated unique identification number and the sequence and spatial location of each article in the lot is tracked at each process step. Such systems can then generate reports, usually in the form of scattergram plots, that illustrate each article's performance characteristic as a function of sequence or location of the article within the lot for each process step.

Performance characteristics for manufactured articles are numerous. Hardness, softness, brightness, clarity, reflectivity, smoothness, luminescence, permeability, and functional tests, both electrical and mechanical, are examples of performance characteristics that may be analyzed for a manufactured article to determine whether it is acceptable. Many of these performance characteristics including electrical test results, may be represented as surface performance characteristic maps. In a surface map, the measure of the performance characteristic is represented as a function of location on the surface of the manufactured article.

One surface performance characteristic mapping system has been developed by the assignee of the present application, Texas Instruments, Incorporated. This system provides a wafer mapping system that shows the evaluation of die on a wafer at multiprobe (MP) test as a function of each die's position on the wafer. Unfortunately, this surface mapping systems, and all others previously developed, does not provide any information on the sequence or position of each article in the lot during each processing step.

Inventors of the present system have developed a system and method for integrating spatial and sequential data for each article in a lot at each process step in a manufacturing flow with surface performance characteristic mapping information to provide sequentially or spatially oriented surface performance characteristic maps for the articles in the lot at each process step. These oriented surface maps allow for quickly identifying deviations or problems in a manufacturing process.

Figure 1:
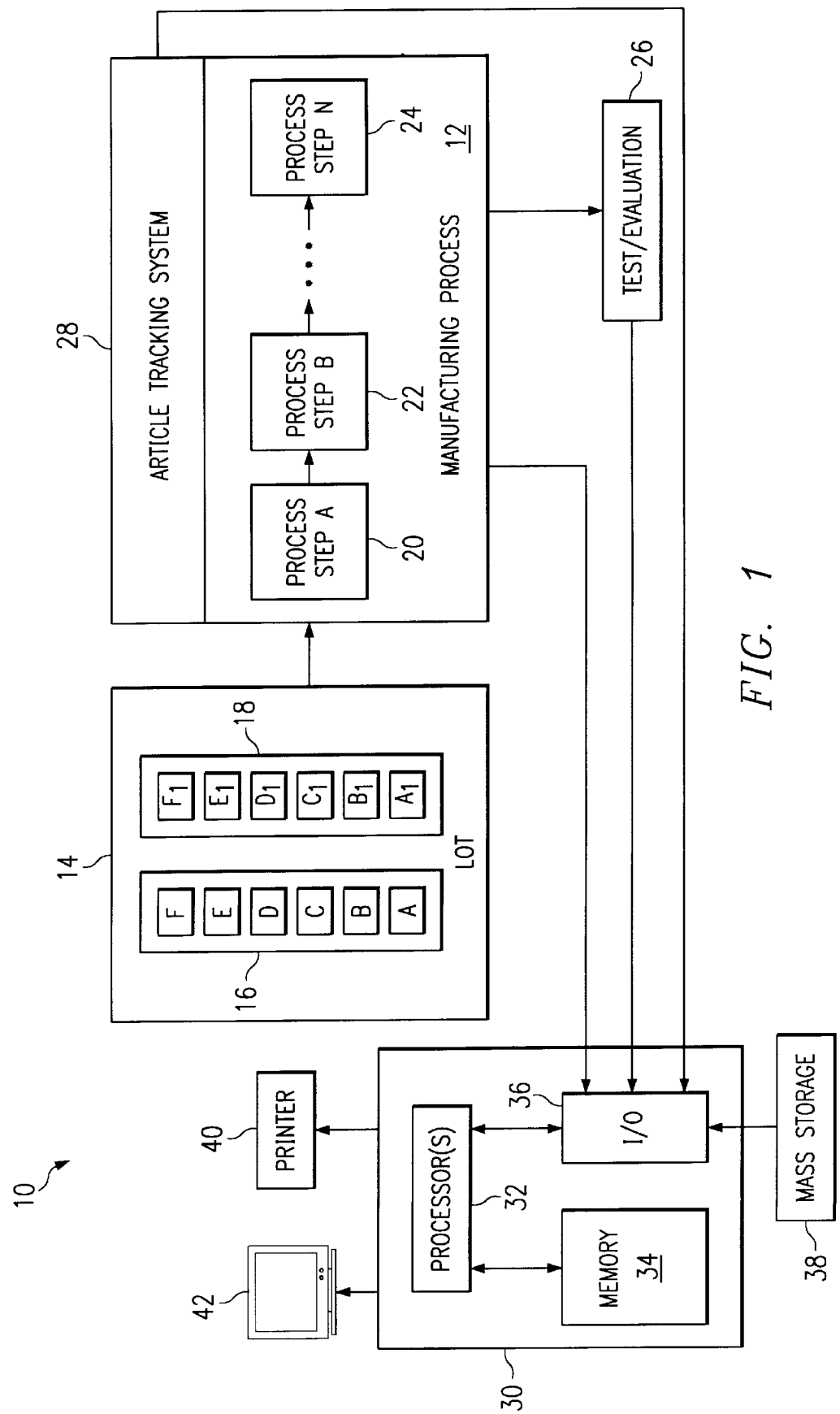
FIG. 1 illustrates a schematic diagram of an embodiment and application of the present system for enhancing the identification of causes of variations in the performance of manufactured articles.

FIG. 1 illustrates analysis system 10. Analysis system 10 may be used to monitor manufacturing process 12 and the articles produced by manufacturing process 12. Manufacturing process 12 is used to process the articles in lot 14, including the articles in sublot 16 and sublot 18. Each sublot includes several articles, e.g., sublot 16 includes articles A through F, while sublot 18 includes articles $A_1$ through $F_1$. The articles in lot 14 are processed through manufacturing process 12 to produce finished articles.

The present system can analyze the manufacture of many types of articles. Examples of the types of articles that may comprise lot 14 include, but are not limited to, semiconductor die or wafers, pieces of metal, printed money, glass, or any article that under goes several processing steps during its manufacture.

Manufacturing process 12 includes several individual process steps as represented by process step A 20, process step B 22, on through to process step N 24. Manufacturing process 12 may comprise any of the steps necessary to complete a manufactured article and the present invention is not limited to any particular manufacturing process or manufactured article. Once the articles in lot 14 are processed through manufacturing process 12, they may be evaluated at test/evaluation 26. Article tracking system 28 is also provided with analysis system 10 so that the sequence and spatial location of each article within lot 14 is tracked as the articles move through manufacturing process 12.

Analysis system 10 also includes processing system 30. Processing system 30 may take many forms, including, for example, one or more computer mainframes, personal computers (PC), or mini-computers. Processing system 30 includes one or more processors 32, memory 34, and input/ output (I/O) 36 for receiving input to processing system 30. Memory 34 in processing system 30 may be dynamic read random access memory (DRAM) and a hard drive suitable for storing computer instructions executed by processor 32 for implementing the present system. Mass storage 38 in the form of optical disk drive, CD ROMs, or magnetic tape may also be included with analysis system 10 to provide additional memory for processing system 30. Processing system 30 is coupled through I/O 36 to printer 40 and display 42 so that oriented surface maps generated in accordance with the present invention may be viewed.

In analysis system 10, article tracking system 28, manufacturing process 12, and test/evaluation 26 provide inputs to processing system 30 so that the results of the manufacture and test of an article within lot 14 can be analyzed.

Figure 2:
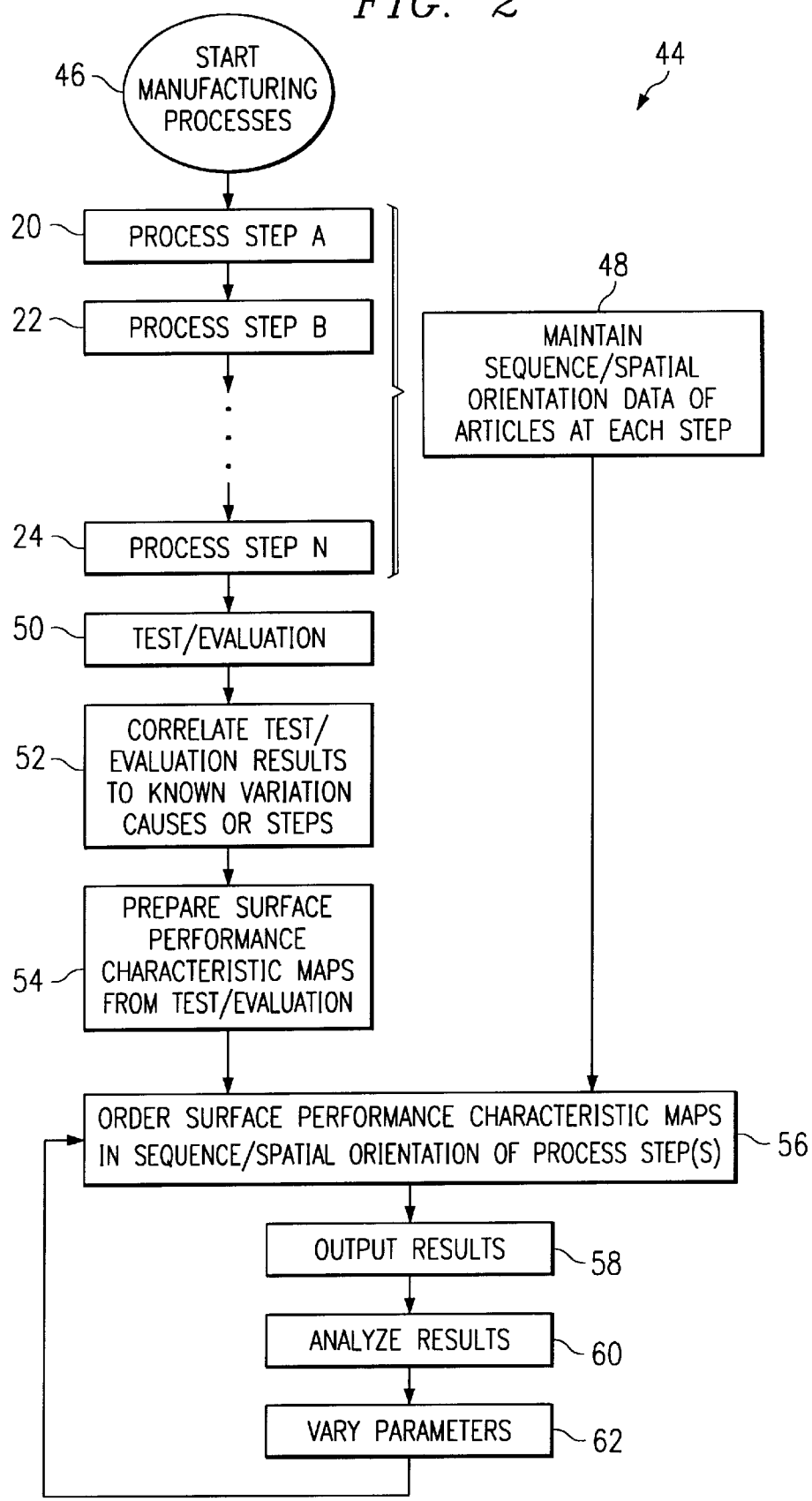
FIG. 2 is an exemplary flow chart for the method of the present invention for enhancing the identification of causes of variations in the performance of manufactured articles.

FIG. 2 illustrates process flow 44, which is an example of the steps executed by analysis system 10 in FIG. 1 for enhancing the identification of causes of variations in the performance of manufactured articles. The manufacturing process starts at step 46 with the articles of lot 14 being introduced into manufacturing process 12. Each of the articles in lot 14 is processed through each of the process steps of manufacturing process 12 including process steps 20, 22, and 24 as represented in FIG. 2.

At step 48, article tracking system 28 maintains the sequence and spatial data of each article in lot 14 at each process step. Each article within lot 14 is assigned a unique identification number. As shown in FIG. 1 the unique identification numbers for the articles in lot 14 are letters as represented by letters A through article $F_1$. Article tracking systems 28 maintains the sequence and spatial data of each article at each process step by reading the unique identification number of each article at each step.

Article tracking system may use bar codes, scanners, indexing, optical readers, or many other suitable systems to read and store the sequence and spatial data of each article in lot 14 at each process step. Determining and storing the sequence and spatial location of each article in lot 14 at each step in manufacturing process 12 is important as the articles can be processed in various sequences and spatial orientations. For example, the articles of lot 14 may be processed at any given process step in the following sequential order: A, B, C, D, E, F, $A_1$, $B_1$, $C_1$, $D_1$, and $F_1$. Alternatively, they may be processed: A, $A_1$, B, $B_1$, C, $C_1$, D, $D_1$, E, $E_1$, F, and $F_1$. The articles may be processed simultaneously as a batch. When lot 14 is processed as a batch, the spatial location of each article in lot 14 is important in analyzing the process. These simple examples illustrate that the sequence and location of each article at each process step can vary greatly. It is therefore important that article tracking system 28 maintain the sequence and spatial data of each article in lot 14 at each process step.

Returning to the flow of FIG. 2, at step 50 each article is tested or evaluated for one or more performance characteristics at test/evaluation 26. The performance characteristics for each article in lot 14 may be stored by processing system 30 in memory 34 or mass storage 38. There are various known methods to correlate test/evaluation results to their causes. An explanation of these methods is not, however, important in describing the inventive concepts of the present invention. One such system is embodied in the Wafer Sleuth system mentioned above that correlates electrical test failures at MP test for die in a lot of semiconductor wafers to an errant semiconductor processing step.

Next, at step 52 processing system 30 correlates the test/evaluation results for lot 14 to known variation causes or steps from the data obtained at step 50. At step 52, analysis system 10 determines which of the process steps in manufacturing process 12 most likely led to the observed performance characteristics at test/evaluation step 50. Next, at step 54 analysis system 10 prepares surface performance characteristic maps from the test/evaluation data for each article. Then at step 56, the surface performance characteristic maps prepared at step 54 may be ordered in the sequence and spatial orientation of the articles in lot 14 at each process step in manufacturing process 12 using the sequence and spatial data stored at step 48. This ordering of the surface performance characteristic maps provides a graphical representation of the surface performance characteristic maps for each article in the sequence or spatial location that the article was processed at a given processing step. This may be output at step 58.

Additionally, at step 60 the results of the ordering of the surface characteristic representations may be analyzed. At step 62, the parameters used for analysis may be varied so that the ordering at step 56 is done in a new format. Discussions relating to FIGS. 9 and 10, hereinafter, provide additional information on steps 60 and 62.

By this way, the present analysis system tracks the sequence and spatial data for each article of manufacture in a lot as the lot is processed in a manufacturing flow. Then, the present system uses the results of test or evaluation of the manufactured articles to generate surface performance characteristic maps for each manufactured article. Then, the system orders the surface performance characteristic maps in the sequence or spatial orientation that the articles were processed at a given process step. This provides an output that may be displayed graphically on a display or on paper via a printer showing the results of the analysis. The present system also has the capability to customize the analysis process for additional analysis.

Figure 3:
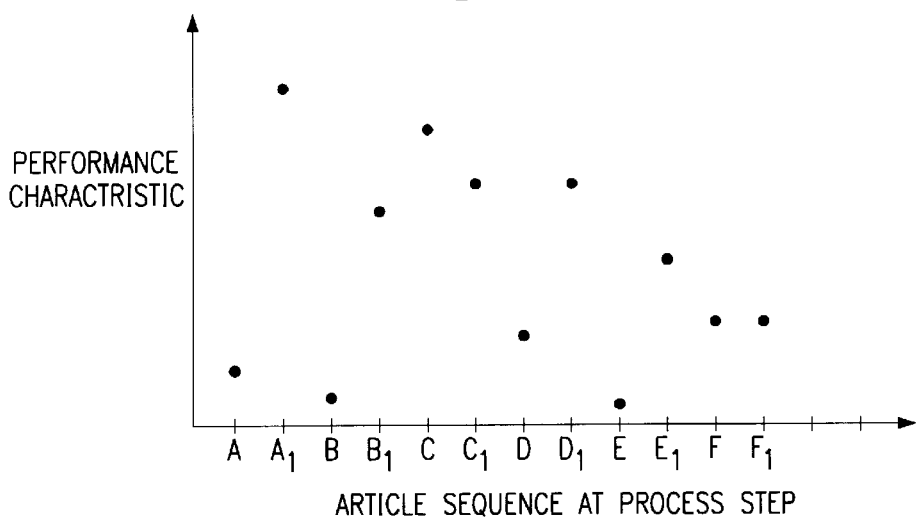
FIG. 3 shows a graph of a performance characteristic for a lot of manufactured articles as a function of the sequencing of the articles at a given manufacturing step.

FIG. 3 is an example scattergram showing a performance characteristic for articles in a lot as a function of their sequence at a given process step. Continuing the example of lot 14 in FIG. 1, the sequence of the articles at the process step represented by FIG. 3 was A, $A_1$, on through to F, $F_1$. By way of an example only, assume the performance characteristic on the Y-axis of FIG. 3 is yield at post-manufacturing testing. The points in the graph of FIG. 3 show that articles A, B, D, E, $E_1$, F, and $F_1$ in lot 14 generally had low yields in comparison to the other articles in lot 14. Using strictly numerical analysis of the failures at this test assumes that the failures resulted from a common failure mechanism. In correlating the performance characteristic data to a given process step, prior systems may improperly group failures that resulted from separate failure mechanisms. The present invention, however, allows for more efficiently identifying the data represented by FIG. 3 using the system of FIG. 1 with the method of FIG. 2.

Figure 4:
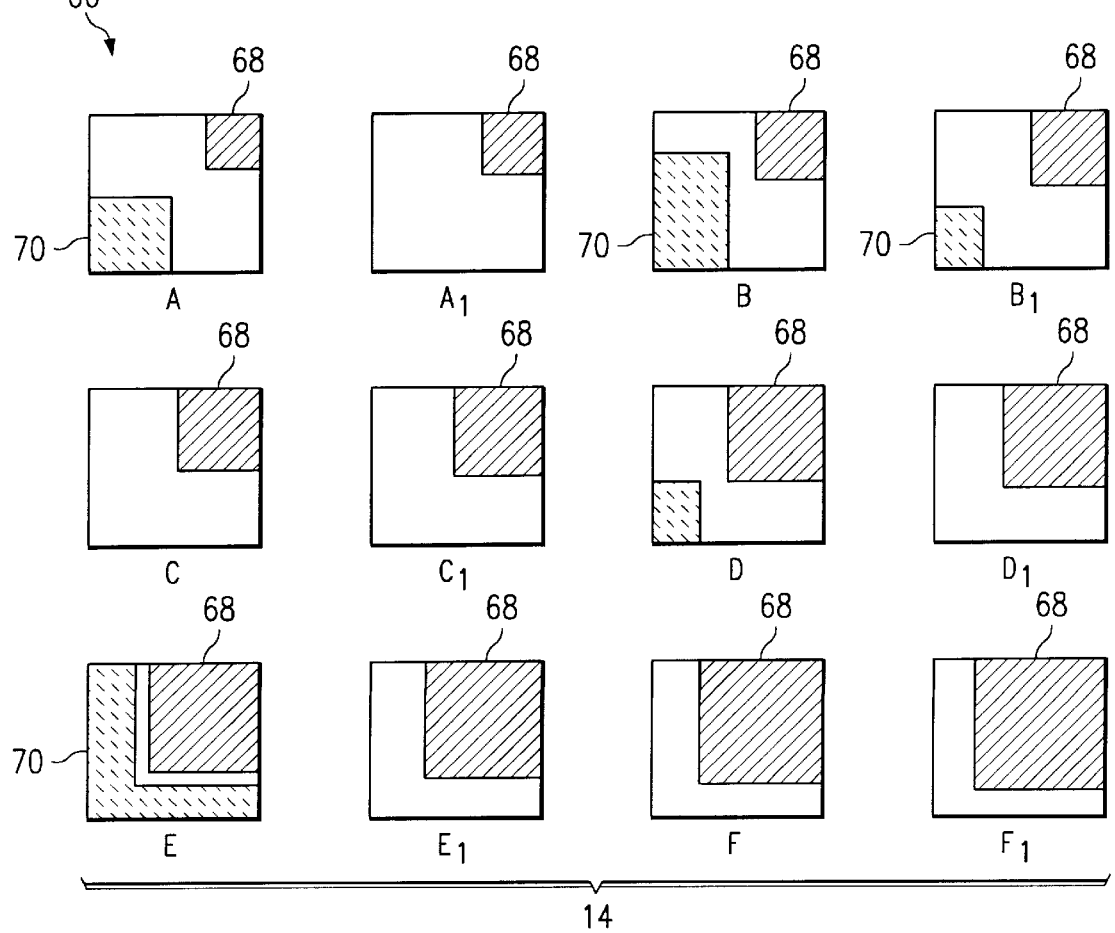
FIG. 4 illustrates sequentially oriented surface maps for a surface performance characteristic for a lot of manufactured articles.

FIG. 4 shows ordered surface performance characteristic maps 66 for the articles in lot 14 and represents the performance characteristics shown in FIG. 3. Articles A through $F_1$ in FIG. 4 are arranged in their order of processing (A, $A_1$,... F, $F_1$) at the process step represented by FIG. 3. Each surface map in FIG. 4 represents the performance characteristic for an article in lot 14.

Each surface map contains one or more shaded areas, which in this example indicates an unacceptable performance characteristic. For example, article A in FIG. 4 contains first region 68 of an unacceptable performance characteristic and second region 70 of an unacceptable performance characteristic. The white or blank areas in article A meet the desired performance characteristic. Regions 68 and 70 may also indicate different failures for a given performance characteristic. Regions 68 and 70 may be many performance characteristics used to evaluate an article of manufacture. For example, if article A is a semiconductor wafer, regions 68 and 70 may represent bad die on the wafer where first region 68 indicates the failure of a first test at MP testing and region 70 indicates the failure of a second test at MP testing.

As shown by FIG. 4, region 68 in each article of lot 14 gets progressively larger as each article is processed through the process step. This indicates that the cause for region 68 on the articles in lot 14 is most likely the result of some variation at the depicted process step. FIG. 4 also shows that region 70 on the articles of lot 14 appears randomly with respect the sequencing of the articles at this process step. Only articles A, B, $B_1$, D, and E contain region 70. This indicates that the cause of region 70 is not the result of the depicted process step in FIG. 4. Where prior analysis systems may group regions 68 and 70 in analyzing the lot, the present invention's ability to depict oriented surface performance characteristic map allows the user to quickly note unrelated failures.

The present system integrates sequential and spatial information for each article in a lot with surface performance characteristic information to provide a clearer picture of the performance characteristic. The present analysis system helps identify when multiple failure mechanisms affect a performance characteristic. Additionally, the present invention allows for more efficiently analyzing performance characteristic information and implementing the necessary corrective action.

Figure 5:
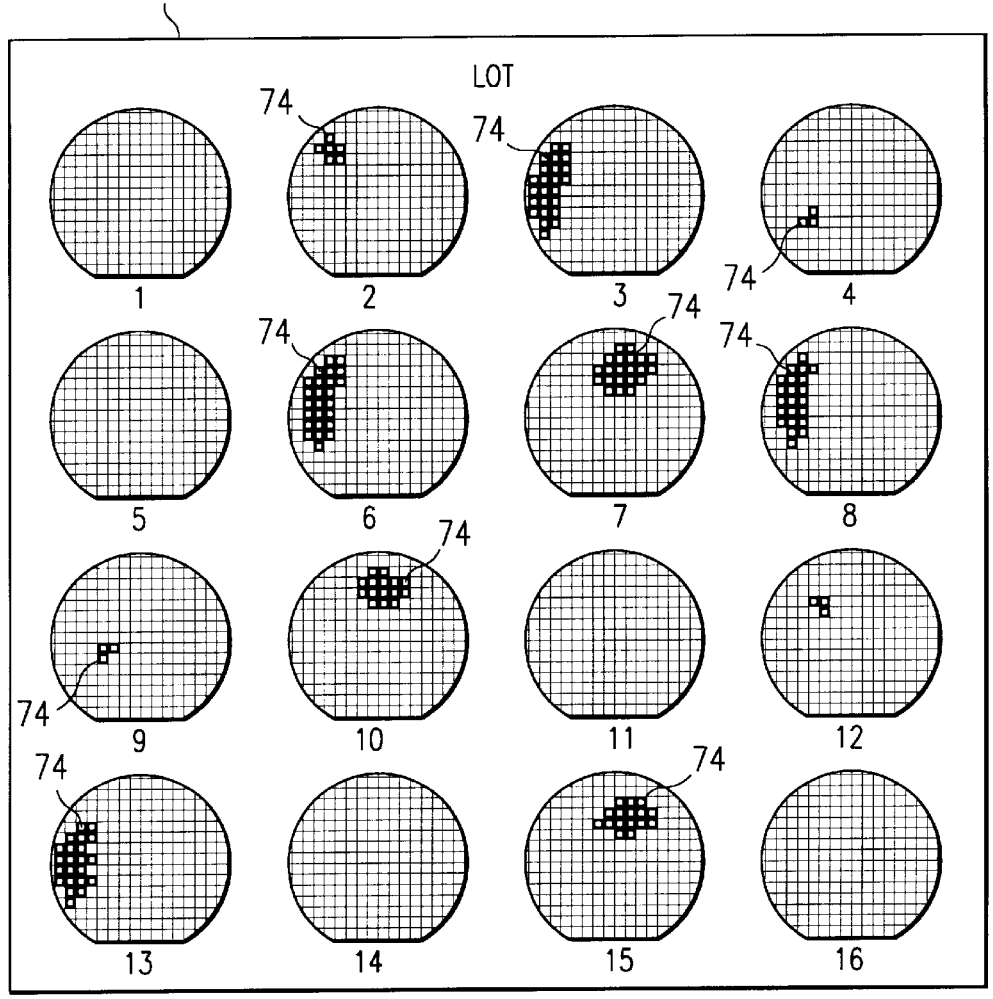
FIG. 5 depicts sequentially ordered wafer maps for a wafer lot using the present system.

FIG. 5 illustrates the output of the present analysis system containing the surface characteristic for the articles in lot 72. Articles 1 through 16 in lot 72 are shown in the order they were processed for a given processing step. Several articles in lot 72 have shaded regions 74 indicating unacceptable or bad regions on each article. Assuming that lot 72 is a lot of semiconductor wafers, then shaded region 74 on each article indicates unacceptable die. In prior analysis systems, using solely numerical analysis of the yield of each wafer in lot 72 may result in the improper conclusion that wafers 3, 6, 7, 8, 10, 13, and 15 have roughly equivalent yields and that a given process step was the root cause of the yields experienced by each wafer.

Viewing the wafer maps for each wafer in lot 72 in the order that they were processed at a given process step as is shown in FIG. 5 clearly shows that there were two failure mechanisms affecting the yield in lot 72. Wafers 3, 6, 8, and 13 experienced failures along their left side, while wafers 7, 10, and 15 experienced failures along the top of each wafer. By displaying the surface performance characteristics or wafer maps for each wafer in lot 72 in the sequential order that the wafers were processed at a given process step, the present system depicts the available data in a manner that can be quickly and efficiently analyzed. The present system, therefore, helps locate the root cause of the failures affecting the lot.

The example illustrated in FIG. 5 may be used to illustrate another possible use of the present invention. The failures observable in FIG. 5 may be separated for analysis purposes. As previously described, previously developed failure analysis systems can correlate observed failures to a given manufacturing process. Such systems may give erroneous results when analyzing the data represented by FIG. 5 because there are obviously two distinct failure modes. To correct for this, a user of the present invention can use the information presented by FIG. 5 to remove certain articles from the analysis process. For example, a user may wish to eliminate wafers 7, 10, and 15 from the analysis of the remaining wafers in lot 72. This allows previously developed analysis systems to provide better analysis results when the remaining data for lot 72 is analyzed.

Figure 6:
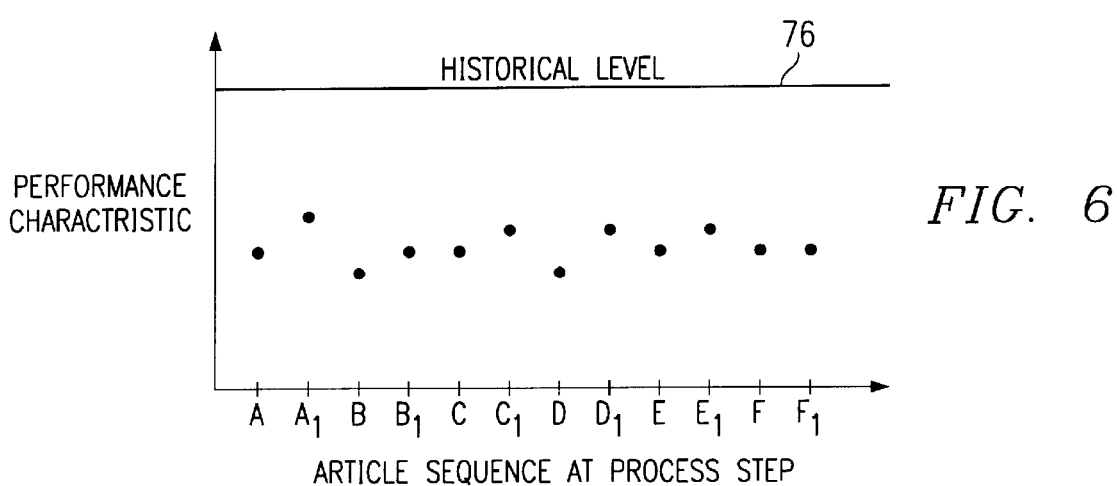
FIG. 6 shows a graph of a performance characteristic for a lot of manufactured articles as a function of the sequencing of the articles at a given process step.

FIG. 6 shows another example of a performance characteristic for a lot of manufactured articles in the sequence or spatial orientation that the articles were processed for given process step. FIG. 6 illustrates the situation where the performance characteristic for all of the articles in the lot falls below their historical level 76. Viewing the numerical representations of the performance characteristic for the lot in FIG. 6 does not provide any significant performance characteristics variations from article to article. Each article within the lot had substantially the same performance characteristic as the other articles in the lot.

FIG. 7 shows the surface performance characteristics for the articles in the lot of FIG. 6 in the order that the articles were processed at a given process step. These surface characteristics show an obvious fail pattern for the articles in the lot that is dependent on the articles order at the process step. The technical advantage of displaying the surface performance characteristic for an article in the order that it was processed for a given step is clear when viewing the data represented in FIG. 7 versus FIG. 6.

Additionally, continuing the example of FIGS. 6 and 7, if the surface performance characteristics for the articles in the lot of FIG. 7 are displayed according to their spatial orientation at a given process step, insight into the failure mechanism may be provided. FIG. 8 shows the spatial orientation of the articles in the lot of FIGS. 6 and 7 as they were processed at a given process step on pallet 80. Using this method, an obvious fail pattern versus spatial orientation within the lot becomes easy to identify. Articles B, D, and F experienced a fail pattern in their lower right quadrant, articles C, $D_1$, and $F_1$ experienced a fail pattern in their lower left quadrant, articles A, $C_1$, and $E_1$ experienced a fail pattern in their upper right quadrant, while articles $A_1$, $B_1$, and E experienced a fail pattern in their upper left quadrant. By knowing the spatial orientation of the articles on pallet 80, the problems affecting the process step become apparent.

Alternatively, the information provided by FIG. 7 may be used to reorder the performance characteristic versus article sequence as shown in FIG. 6. By assigning a numeric value to the fail patterns (upper left quadrant fail=1; upper right failure pattern=2; lower left failure pattern=3; and lower right failure pattern=4), these values may be used to generate a display of the failed quadrant value versus operation sequence. FIG. 9 continues the example of FIGS. 6, 7, and 8 and shows this new way of ranking the observed fail patterns. Whereas FIG. 6 provides no obvious fail pattern, FIG. 9, by observing and ranking the fail patterns, shows an obvious problem at this operation sequence.

Figure 10:
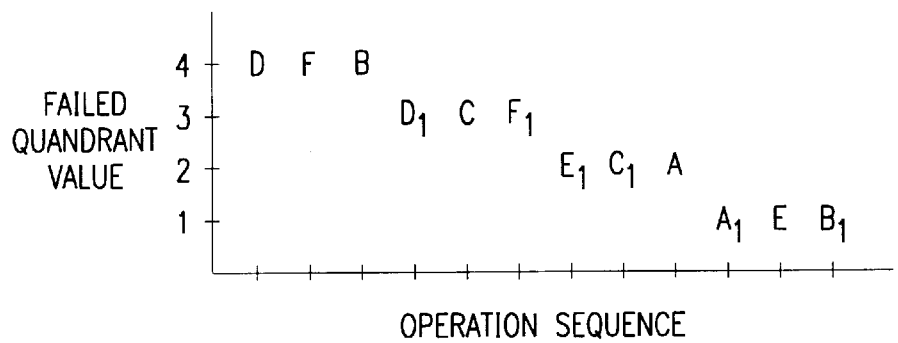

FIG. 10 shows an alternative way of presenting the information in FIG. 9. If the failed quadrant value is sorted first by pallet 80 location and then by the sequence number, then the graph of FIG. 6 becomes as shown in FIG. 10. Articles D, F, and B failed in quadrant 4, articles $D_1$, C, and $F_1$ failed in quadrant 3, articles $E_1$, $C_1$, and A failed in quadrant 2, and articles $A_1$, E, and $B_1$ failed in quadrant 1. This helps clearly show the failure patterns for the articles within the lot.

Figure 11:
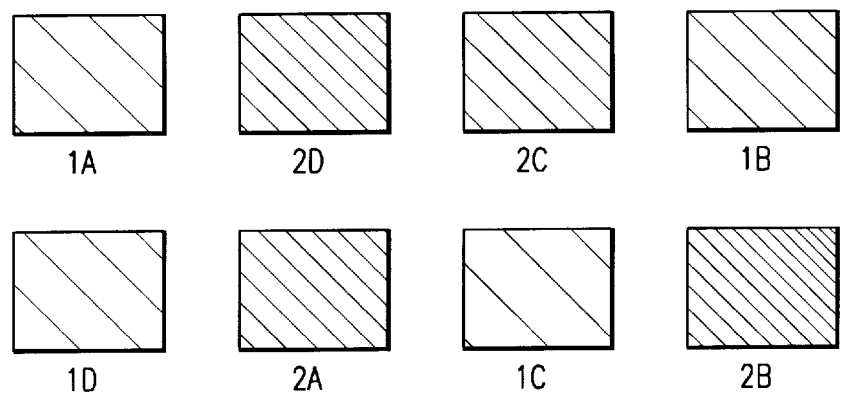
FIG. 11 illustrates luminescence curves for a lot of panels.
Figure 12:
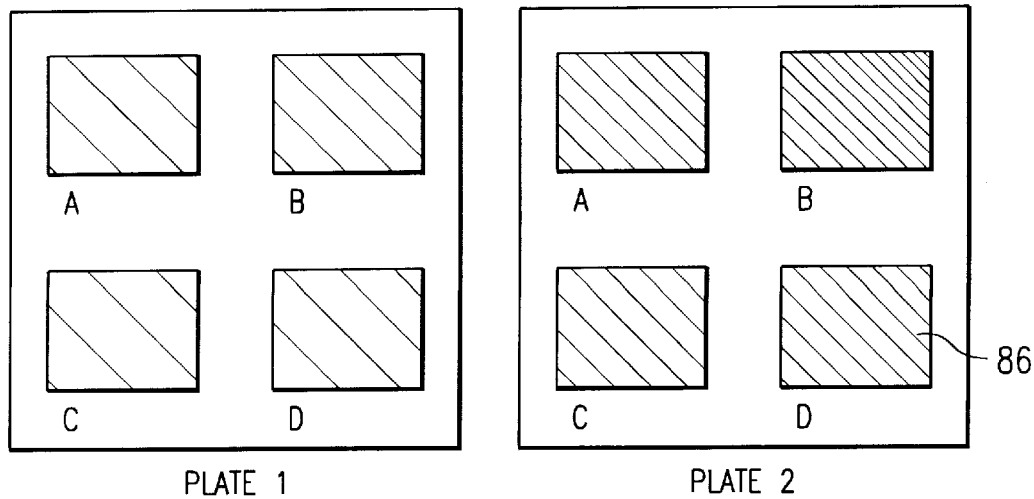
FIG. 12 shows the luminescence curves of FIG. 11 in their spatial orientation during processing in accordance with the present invention.

FIGS. 11 and 12 illustrate the use of the present invention with lots containing only a few articles of manufacture. An example of such an article of manufacture would be a field emission display (FED) flat panel display. In FED flat panel display processing, the analysis of variations between panels is complicated by the fact that the resolution of good versus bad panels is very poor. Typically, four panels are processed from each plate of glass. This makes numerical analysis difficult because the yield is either 100%, 75%, 50%, 25% or 0%. If, however, the spatial orientation of each panel on a given plate is maintained for each processing step in accordance with the present invention, then the variation resulting from panel to panel can be easily observed.

FIG. 11 shows panels 1A, 2D, 2C, 1B, 1D, 2A, 1C, and 2B showing their luminescence curves following manufacture and in the order that the panels were tested. Viewed in this way, there is no apparent root cause for the varying luminescence curves on each panel.

FIG. 12, however, shows the output of the present analysis system where the spatial and sequential information for each panel on a given plate has been maintained. Plate 1 in FIG. 12 includes panels 1A, 1B, 1C, and 1D, and plate 2 includes panels 2A, 2B, 2C, and 2D. Plates 1 and 2 were processed in a given processing step that resulted in the luminescence curves 86 as shown. Viewed in this way it is clear that the luminescence of panels on plates 1 and 2 was drastically affected as the plates went through the processing step. Whereas FIG. 11 shows no obvious processing problem, displaying the spatial orientation of the panels in FIG. 12 shows an obvious failure mechanism.

In operation of the present invention, a tracking system is used to maintain the sequential or spatial orientation of each article of a given lot as the lot is processed through a manufacturing flow. Once the manufacturing of the article is completed a test or evaluation of one or more performance characteristics for the articles is made. The results of this test or evaluation can then be represented as a surface performance characteristic map for the surface of the article of manufacture. These surface performance characteristics can then be oriented in the spatial and sequential order that the articles were actually processed for each given manufacturing step. This, in turn, provides a quick and efficient way to observe the results of a given processing step and helps identify failure mechanisms in a more efficient manner.

The present invention provides several technical advantages. The present system can be used to analyze any manufactured article that may be represented with surface performance characteristic mapping. The present invention provides a quick and efficient way to analyze manufacturing process flows and to identify where multiple root causes are leading to failures.

Although the present invention has been described in detail, it should be understood that various changes, substitutions, and alterations can be made hereto without departing from the spirit and scope of the invention as defined by the appended claims.

What is claimed is:

1. In a system wherein articles are manufactured by a plurality of process steps, a method for helping identify causes of variations in performance of the manufactured articles, the method comprising the steps of:

tracking orientation data for the articles during each of the process steps, wherein the orientation data comprises data selected from the group consisting of sequential data and spatial location data;

measuring performance data for each of the articles;

preparing surface performance characteristic maps for each of the articles from the performance data; and ordering the surface performance characteristic maps for each of the articles in accordance with the orientation data for each article at a given process step.

2. The method of claim 1 wherein the orientation data comprises sequential and spatial location data.

3. The method of claim 1 further comprising the step of correlating the performance data for each of the articles to known variation causes to identify a cause for the variations in the performance of each article.

4. The method of claim 1 further comprising the step of displaying the surface performance characteristic maps for each of the articles in the orientation of the articles for a given process step.

5. The method of claim 1 wherein the articles are semiconductor wafers and the process steps are semiconductor processing steps.

6. The method of claim 1 wherein the articles of manufacture are panels of glass formed from a single plate of glass.

7. The method of claim 1 further comprising the steps of:

arranging the articles into groups in accordance with the surface performance characteristic maps for each article;

assigning numerical performance values to spatial characteristics for each article in a group; and correlating the numerical performance values of the articles in each group as a function of the orientation data for each article in each process step.

8. The method of claim 1, further comprising the steps of:

identifying a subgroup of articles with a common characteristic;

correlating causes of variation with the performance data from the articles which are not in the subgroup.

9. The method of claim 8, wherein the performance data is yield data.

10. The method of claim 8, wherein the performance data is luminescence data.

11. The method of claim 8, wherein the causes of variation comprise process steps.

12. A system for helping identify causes of variations in performance of manufactured articles when the articles are manufactured by a plurality of process steps, the system comprising:

an article tracking system for tracking orientation data for each article at each process step, wherein the orientation data comprises data selected from the group consisting of sequential data and spatial location data;

a tester for measuring performance data for each of the articles; and a processing system for preparing surface performance characteristic maps for each of the articles from each article's performance data and for ordering the surface performance characteristic maps for each of the articles in accordance with the orientation data for each article at each given process step.

13. The system of claim 12 wherein the orientation data comprises sequential and spatial location data.

14. The system of claim 12 wherein the processing system is further operable to correlate the performance of each of the articles to known variation causes.

15. The system of claim 12 further comprising an output device for displaying the surface performance characteristic maps for each of the articles in the orientation of the articles for each process step.

16. The system of claim 12 wherein the articles are semiconductor wafers and the process steps are semiconductor processing steps.

17. The system of claim 12 wherein the articles of manufacture are panels of glass formed from a single plate of glass.

18. The system of claim 12 wherein the processing system is further operable to receive input which identifies groups of articles, to receive assignments of numerical performance values to spatial characteristics for each article in a group, and to correlate the numerical performance values of the articles in each group as a function of the orientation data for each article in each process step.

19. The system of claim 12, wherein the processing system is further operable to receive input which identifies subgroups of articles; and correlate causes of variation with the performance data from the articles which are not in the identified subgroup.

20. The method of claim 19, wherein the performance data is yield data.

21. The method of claim 19, wherein the performance data is luminescence data.

22. The method of claim 19, wherein the causes of variation comprise process steps.

23. In a system wherein articles are manufactured by a plurality of process steps, a method for identifying causes of variations in performance of the manufactured articles, the method comprising the steps of:

tracking sequential and spatial orientation data for the articles during each of the process steps;

measuring performance data for each of the articles;

preparing surface performance characteristic maps for each of the articles from the performance data;

ordering the surface performance characteristic maps for each of the articles in accordance with the sequential and spatial orientation data for each article from one given process step, thereby creating an ordered surface performance characteristic map set;

displaying the ordered surface performance characteristic map set in the orientation of the articles for the given process step; and correlating the performance data for each of the articles to known variation causes to identify a cause for the variations in the performance of each article.

24. The method of claim 23 wherein the articles are semiconductor wafers and the process steps are semiconductor processing steps.

25. The method of claim 23 wherein the articles of manufacture are panels of glass formed from a single plate of glass.

26. A method of enhancing the identification of the causes of quality variations in articles, batches of which are manufactured by plural process steps, the method comprising:

tracking the sequence in which the articles of each batch are subjected to each of the process steps to produce sequential data;

tracking the orientation of each article relative to a spatial reference as it is subjected to at least one of the process steps to produce orientation data;

measuring the quality of the articles following completion of the process steps to produce quality data;

preparing a surface performance characteristic map for each article using the data produced in the measuring step;

ordering the surface performance characteristic map in accordance with at least a portion of the sequence and orientation data to create an ordered set of surface performance characteristic maps; and and correlating the ordered set of surface performance characteristic maps with known variation causes to identify a cause for the variations in the performance of the articles.

* * * * *

UNITED STATES PATENT AND TRADEMARK OFFICE
CERTIFICATE OF CORRECTION

PATENT NO. : 5,963,881
DATED : October 5, 1999
INVENTOR(S) : Randall W. Kahn; Henry G. Prosack, Jr., and Kenneth G. Vickers It is certified that error appears in the above-indentified patent and that said Letters Patent is hereby corrected as shown below:

Cover Page, Item [75], Inventors:

change    "Hank G. Prosack"

to    --Henry G. Prosack, Jr.--

Signed and Sealed this

Tenth Day of April, 2001

Attest:

NICHOLAS P. GODICI

Attesting Officer    Acting Director of the United States Patent and Trademark Office